US008803124B2

(12) United States Patent
Pramanik et al.

(10) Patent No.: US 8,803,124 B2
(45) Date of Patent: Aug. 12, 2014

(54) CREATING AN EMBEDDED RERAM MEMORY FROM A HIGH-K METAL GATE TRANSISTOR STRUCTURE

(75) Inventors: Dipankar Pramanik, Saratoga, CA (US); Tony P. Chiang, Campbell, CA (US); David Lazovsky, Los Gatos, CA (US)

(73) Assignee: Intermolecular, Inc., San Jose, CA (US)

( * ) Notice: Subject to any disclaimer, the term of this patent is extended or adjusted under 35 U.S.C. 154(b) by 350 days.

(21) Appl. No.: 13/407,997

(22) Filed: Feb. 29, 2012

(65) Prior Publication Data

US 2013/0221317 A1    Aug. 29, 2013

(51) Int. Cl.
*H01L 47/00*    (2006.01)
(52) U.S. Cl.
USPC ............... 257/5; 257/2; 257/4; 257/E47.001; 257/E47.004; 438/382
(58) Field of Classification Search
USPC .......... 257/2, 5, E47.001, E21.004, E27.026, 257/E27.07, E31.001, E31.027; 438/382
See application file for complete search history.

(56) References Cited

U.S. PATENT DOCUMENTS

| 5,229,310 | A | 7/1993 | Sivan |
| 6,465,804 | B1 | 10/2002 | Shamir |
| 6,627,971 | B1 | 9/2003 | Shen |
| 7,129,534 | B2 | 10/2006 | Tuttle |
| 7,510,929 | B2 | 3/2009 | Chen |
| 7,835,170 | B2 | 11/2010 | Bertin et al. |
| 7,935,619 | B2 | 5/2011 | Jung |
| 7,936,583 | B2 | 5/2011 | Khoury |
| 7,960,216 | B2 | 6/2011 | Phatak |
| 7,961,497 | B2 | 6/2011 | Khoury |
| 7,974,119 | B2 | 7/2011 | Chen |
| 7,977,152 | B2 | 7/2011 | Gorer et al. |
| 8,008,096 | B2 | 8/2011 | Fuchigami et al. |
| 8,569,731 | B2 * | 10/2013 | Konno et al. ............ 257/4 |
| 2007/0008773 | A1 | 1/2007 | Scheuerlein |
| 2008/0160734 | A1 | 7/2008 | Bertin et al. |
| 2009/0230505 | A1 * | 9/2009 | Dennison ............ 257/522 |
| 2009/0257264 | A1 | 10/2009 | Hoenigschmid |

* cited by examiner

*Primary Examiner* — Roy Potter (57) ABSTRACT

An embodiment of the present invention sets forth an embedded resistive memory cell that includes a first stack of deposited layers, a second stack of deposited layers, a first electrode disposed under a first portion of the first stack, and a second electrode disposed under a second portion of the first stack and extending from under the second portion of the first stack to under the second stack. The second electrode is disposed proximate to the first electrode within the embedded resistive memory cell. The first stack of deposited layers includes a dielectric layer, a high-k dielectric layer disposed above the dielectric layer, and a metal layer disposed above the high-k dielectric layer. The second stack of deposited layers includes a high-k dielectric layer formed simultaneously with the high-k dielectric layer included in the first stack, and a metal layer disposed above the high-k dielectric layer.

21 Claims, 8 Drawing Sheets

CREATING AN EMBEDDED RERAM MEMORY FROM A HIGH-K METAL GATE TRANSISTOR STRUCTURE

BACKGROUND OF THE INVENTION

1. Field of the Invention

This invention relates to resistive memory elements and, more particularly, to creating an embedded resistive memory element from a high-k metal gate transistor structure.

2. Description of the Related Art

Microcontroller and logic chips require large blocks of embedded memory consisting of arrays of nonvolatile memory cells (devices). Each cell typically includes a transistor element as well as a memory element, such as a floating gate transistor or a variable resistor. Some memory elements, like the floating gate transistor, add additional process steps, such as a patterned polysilicon layer. Others, like certain variable resistor structures, use material films and structures that are incompatible with transistors and have to use extra fabrication steps to create them. For example, in one implementation, the resistive memory element is fabricated on top of the drain of the transistor element, which also adds steps to the overall fabrication process. Like other semiconductor devices, the cost and time required to fabricate embedded nonvolatile memory devices increases as the number of processing steps increases.

As the foregoing illustrates, what is needed in the art is a resistive memory cell design that can be fabricated more efficiently than previously disclosed resistive memory cells for embedded memories.

SUMMARY OF THE INVENTION

One embodiment of the present invention sets forth an embedded resistive memory cell. Such a structure includes a first stack of deposited layers, a second stack of deposited layers, a first electrode disposed under a first portion of the first stack, and a second electrode disposed under a second portion of the first stack and extending from under the second portion of the first stack to under the second stack, where the second electrode is disposed proximate to the first electrode. The first stack of deposited layers includes a dielectric layer, a high-k dielectric layer disposed above the dielectric layer, and a metal layer disposed above the high-k dielectric layer. The second stack of deposited layers includes a high-k dielectric layer formed simultaneously with the high-k dielectric layer included in the first stack, and a metal layer disposed above the high-k dielectric layer.

Another embodiment of the present invention sets forth a memory array that includes a plurality of embedded resistive memory cells, and yet another embodiment of the present invention sets for a method for creating an embedded resistive memory cell.

One advantage of the embedded resistive memory cell disclosed and described herein is that the transistor element and resistive memory element are fabricated simultaneously. Such an approach results in few fabrication steps compared to separately creating and then joining the transistor element and the resistive memory element and also results in a device that uses less overall die space.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

FIGS. 1A-1L illustrate the various fabrication steps for creating an embedded resistive memory cell, according to one embodiment of the present invention. As is well-known, an embedded resistive memory cell typically includes a transistor element that is configured to drive current through a resistive memory element in order to set and reset the resistive memory element. Persons skilled in the art will recognize and understand that the figures conceptually illustrate only a subset of the process steps that would be used to actually form the embedded resistive memory cell shown and described herein. The particular figures and process steps shown and described, however, have been selected to more clearly highlight some of the more salient aspects of embodiments of the present invention. In no way are the figures and process step descriptions intended to narrow or otherwise limit any embodiments of the present invention.

Figure 1A:
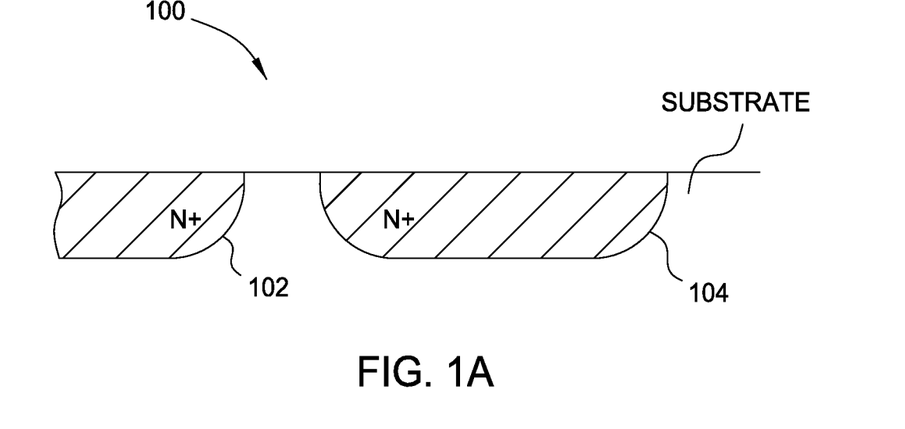
FIGS. 1A-1L illustrate the various fabrication steps for creating an embedded resistive memory cell, according to one embodiment of the present invention.

As shown in FIG. 1A, when creating an embedded resistive memory cell 100, two N+ regions 102 and 104 are first formed using a conventional ion implant process or other technically feasible process. As will be clear in subsequent figures and descriptions, N+ region 104 is an extended version of one of the electrodes that typically would be present in a conventional high-k metal gate transistor structure. N+ region 104 extends from under one side of the transistor element within the embedded resistive memory cell 100 to under the entirety of the resistive random access memory (ReRAM) element within the embedded resistive memory cell 100. Forming N+ region 104 in this fashion allows current to pass from the transistor element to the ReRAM element during operation of the embedded resistive memory cell 100 so that the resistive state of the ReRAM element can be set and sensed.

Figure 1B:
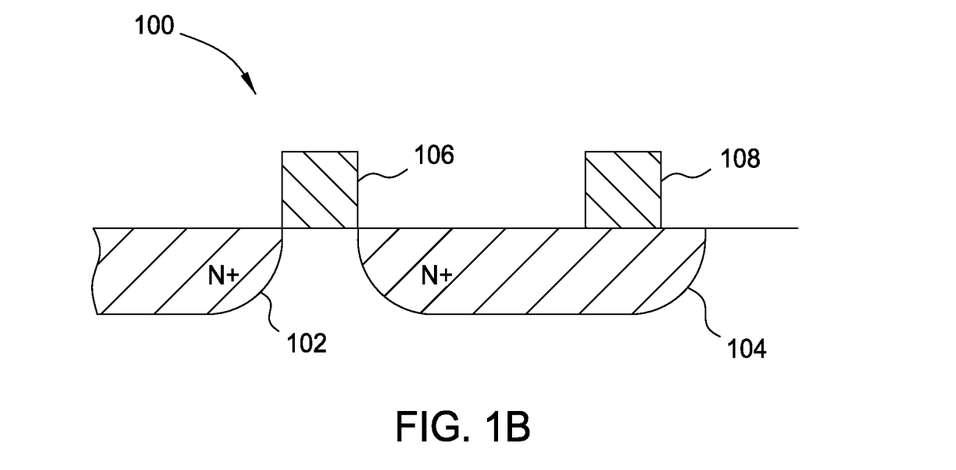
Figure 1C:
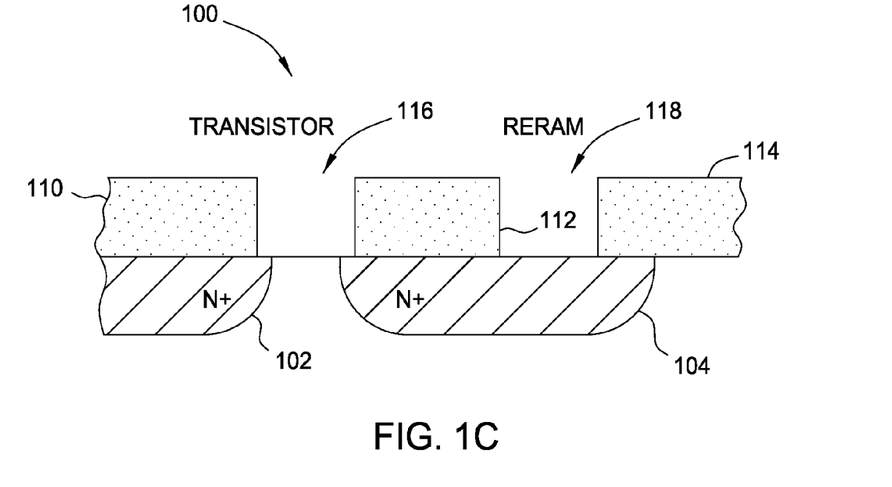
Figure 1D:
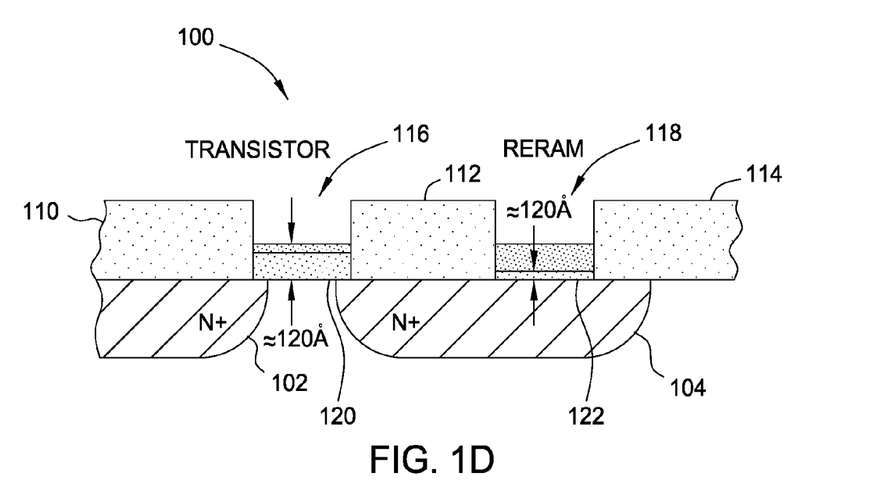
Figure 1E:
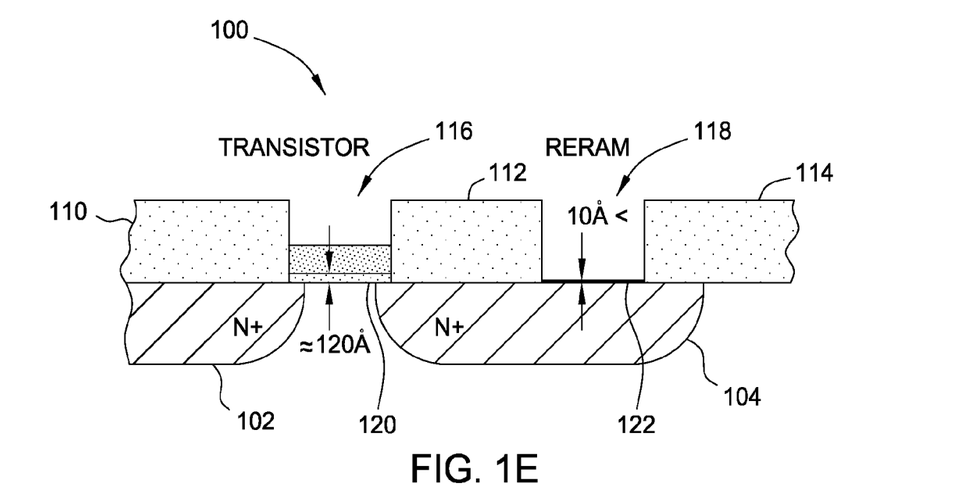

As shown in FIG. 1B, a silicon dioxide layer of around 30-50 angstroms is thermally grown, followed by a deposition of a polysilicon layer that is patterned to form polysilicon dummy structures 106 and 108. Next, as shown in FIG. 1O, a trench for transistor element 116 and a trench for ReRAM element 118 are created by first depositing a dielectric layer, such as SiO2, using, for example, a chemical vapor deposition (CVD) process, planarizing the surface of the overall structure using a chemical mechanical polish (CMP) process, and then removing the polysilicon dummy structure 106 and 108 with an etch process that is selective to the dielectric material. As shown in FIG. 1D, an SiO2 layer is initially built within both the trench for the transistor element 116 and the trench for the ReRAM element 118. Approximately 120 angstroms of SiO2 are grown in the trench of the transistor element 116, resulting in an SiO2 layer 120, as well as in the trench for the ReRAM element 118, resulting in an SiO2 layer 122. To achieve such layers of differing thickness, the transistor area is patterned and masked by a photolithographic layer, and the SiO2 layer 122 is then removed from the trench for the ReRAM element 118 using a wet etch, such as dilute HF or a plasma dry etch. The photomask on transistor area is removed, resulting in the SiO2 layer 120 having a thickness of approximately 120 angstroms. As persons skilled in the art will understand, a residual amount of SiO2 may re-grow in the trench for the ReRAM element 118 after the entire process is complete due to exposure to atmosphere. However, the thickness of any such residual SiO2 layer 122 should be less than approximately 10 angstroms so that the performance of the ReRAM element 118 is not adversely affected. The result of removing SiO2 layer 122 is illustrated in FIG. 1E.

Figure 1F:
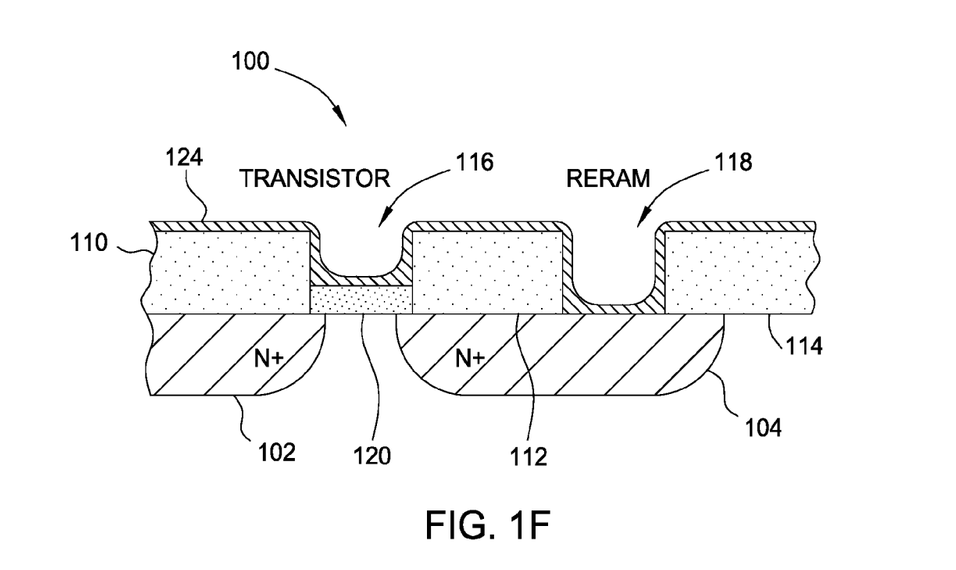

As shown in FIG. 1F, a metal oxide layer 124 is then simultaneously added to both the trench of the transistor element 116 and the trench of the ReRAM element 118. More specifically, a conformal layer of an appropriate metal oxide is added to the embedded resistive memory cell 100 using an atomic layer deposition process or other technically feasible process. The thickness of the resulting metal oxide layer 124 preferably is between approximately 30 angstroms and approximately 50 angstroms. Because the metal oxide layer 124 is being added to both the transistor element 116 as trench as the ReRAM element 118, the metal oxide should be selected to ensure proper performance of both the transistor element 116 and the ReRAM element 118. Proper performance of the transistor element 116 is especially important because the metal oxide layer impacts every transistor on the chip being fabricated. Consequently, the metal oxide material should be a high-k dielectric material. In a preferred embodiment, the metal oxide material comprises hafnium oxide. Other appropriate metal oxides include zirconium oxide, lanthanum oxide, tantalum oxide, aluminum oxide, yttrium oxide, dysprosium oxide, and ytterbium oxide. In alternative embodiments, other materials may be used so long as the resulting transistor element 116 and the ReRAM element 118 perform according to specification.

Figure 1G:
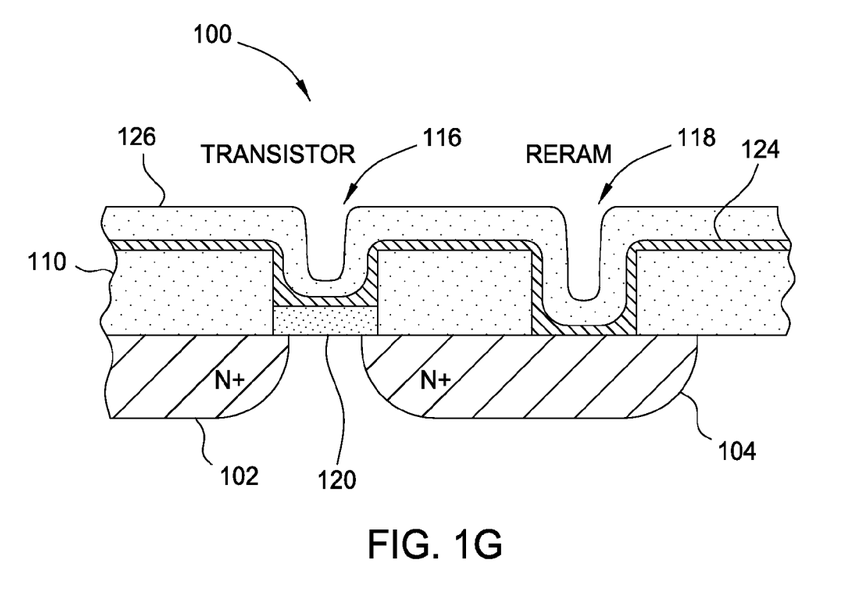
Figure 1H:
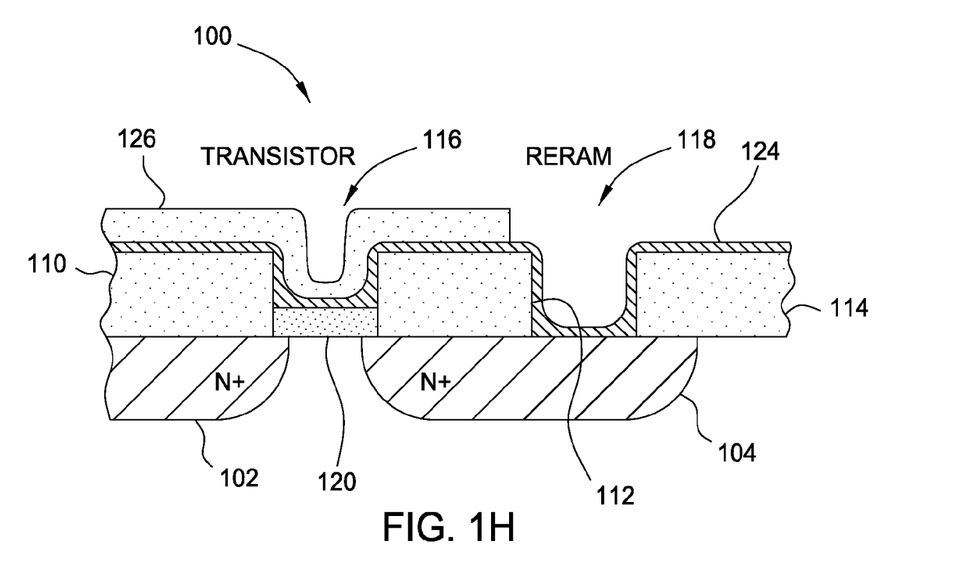
Figure 1I:
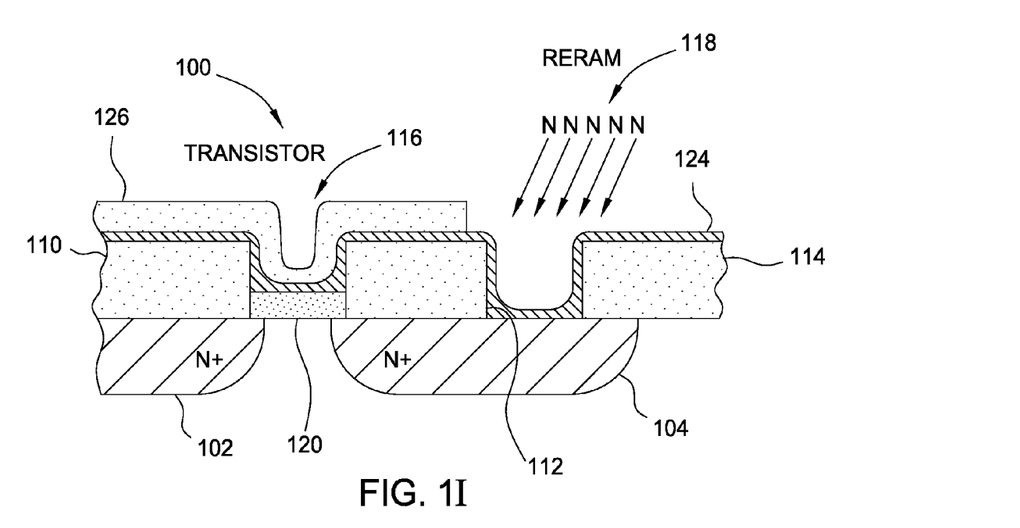
Figure 1J:
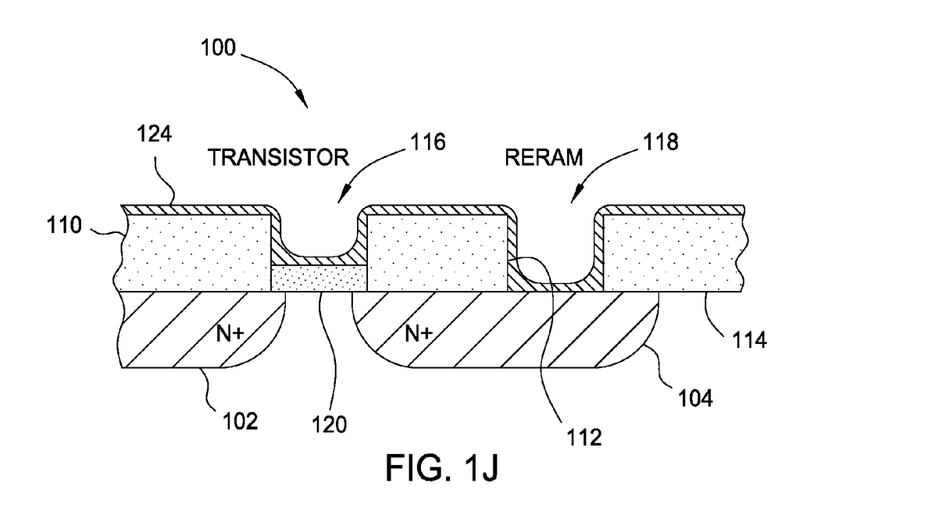

In some implementations, both the metal oxide layers 120 and 124 may be nitridized to improve the properties of both the transistor and the resistive memory. Nitridization is optional, and overall specification requirements typically dictate whether such a step is needed. In other implementations, it may be desirable to nitridize only the metal oxide 124 and not 120. In such a case, when performing nitridization, a protective layer first should be built to shield the transistor element 116 from that process. As shown in FIG. 1G, a conformal SiO2 layer 126 may be added to the embedded resistive memory cell 100 using a CVD process or other appropriate process. The SiO2 layer 126 may then be patterned, masked and etched to remove the SiO2 material from the side of the embedded resistive memory cell 100 that includes the ReRAM element 118, as illustrated in FIG. 1H. After removing the SiO2 material, the nitridization step may be performed on the side of the embedded resistive memory cell 100 that includes the ReRAM element 118 using an thermal ammonia-based anneal or a nitrogen plasma process, as illustrated in FIG. 1I. The SiO2 material that remains on the side of the embedded resistive memory cell 100 that includes the transistor element 116 protects the transistor element 116 from being exposed to the reactive nitrogen atoms/ions during the nitridization step. Once nitridization is complete, the rest of the SiO2 layer 126 may be removed using a wet etch process that is highly selective to the metal oxide material in the metal oxide layer 124. The result of removing SiO2 layer 126 is illustrated in FIG. 1J.

Figure 1K:
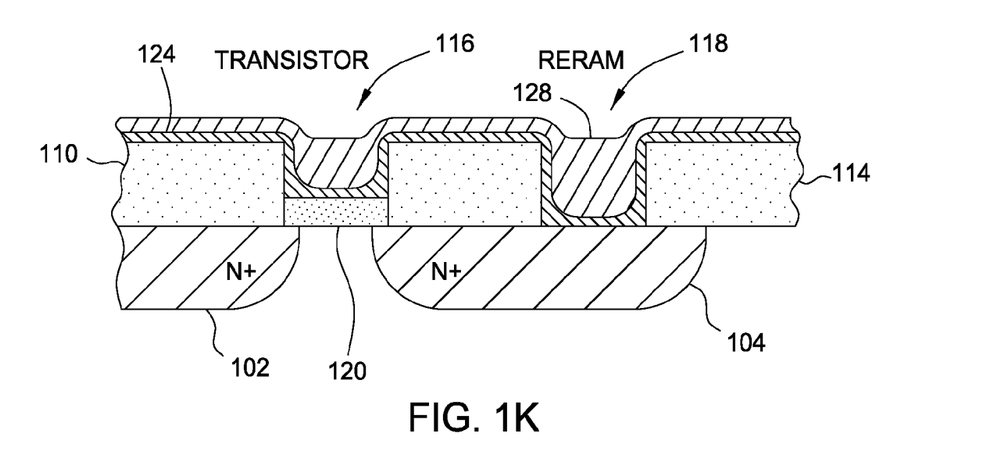
Figure 1L:
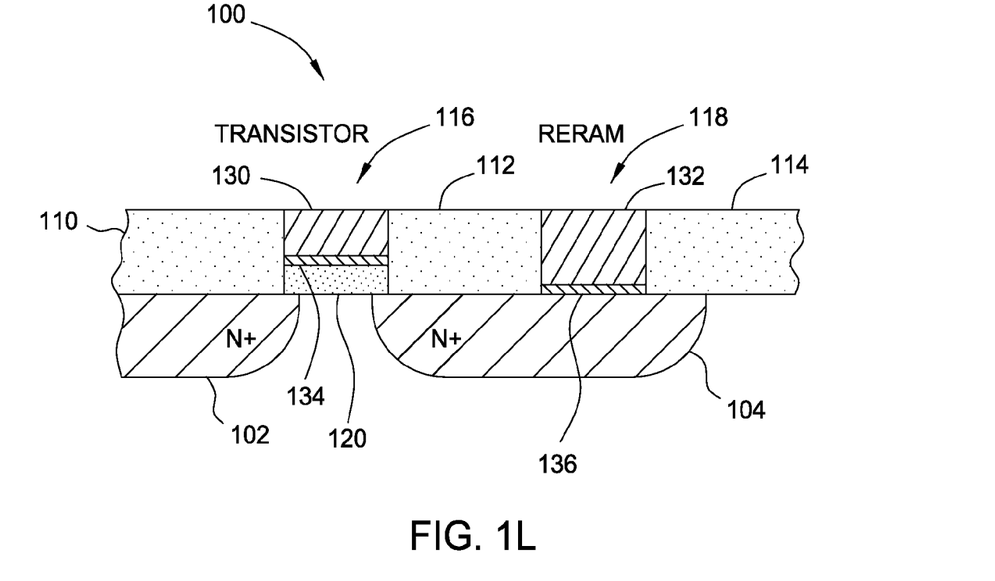

As shown in FIG. 1K, a metal layer 128 is added to the embedded resistive memory cell 100 above the metal oxide layer 124 using a CVD process or a physical vapor deposition (PVD) process. Lastly, a chemical-mechanical polishing (CMP) process is used to polish flat the top of the embedded resistive memory cell 100 and remove portions of the metal layer 128 and the metal oxide layer 124 to separate the transistor element 116 and the ReRAM element 118. As shown in FIG. 1L, the resulting transistor element 116 is comprised of a stack of layers that includes the SiO2 layer 120, a metal oxide layer 134 and a metal layer 130. Similarly, the resulting ReRAM element 118 is comprised of a stack of layers that includes a metal oxide layer 136 and a metal layer 132. The metal layers 130 and 132 form the top electrodes of the transistor element 116 and the ReRAM element 118, respectively.

Once the embedded resistive memory cell 100 has been fabricated, a forming voltage may be applied to the ReRAM element 118 to create conducting filaments within the metal oxide layer 136. Forming is done by applying a voltage between 2-5V between electrodes 132 and 104. Electrode 104 is connected to the source of the forming voltage through the transistor element 116 by applying a voltage of 6V to the electrode 130 and a voltage of 2-5V to the electrode 102. To the extent a forming voltage is applied to the ReRAM element 118, the SiO2 layer 120 thickness is chosen to protect the transistor element 116 from being damaged during this process. Depending on the level of the forming voltage needed to create the conductive filaments, the thickness of the SiO2 layer 120 may vary. In most implementations, however, the thickness of the SiO2 layer 120 should be between approximately 20 angstroms and approximately 120 angstroms, although other technically appropriate thicknesses of the SiO2 layer 120 fall within the scope of the present invention.

Figure 2:
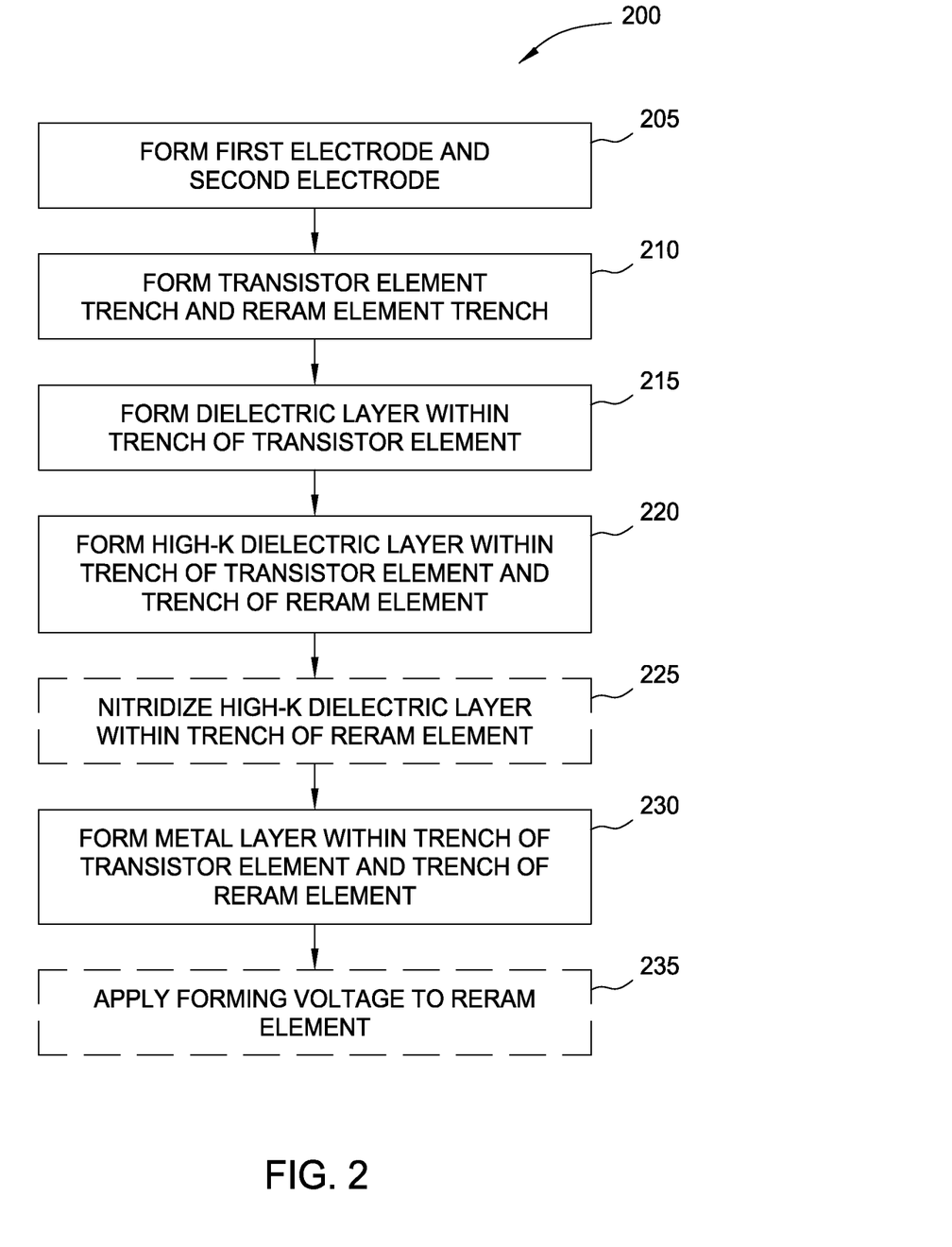
FIG. 2 is a flow diagram of method steps for creating an embedded resistive memory cell, according to one embodiment of the present invention.

FIG. 2 is a flow diagram of method steps for creating an embedded resistive memory cell, according to one embodiment of the present invention. Although method 200 is described in conjunction with FIGS. 1A-1L, persons skilled in the art will understand that any process that implements the method steps, in any order, falls within the scope of the present invention.

The method 200 begins in step 205, where a first electrode and a second electrode are formed using a conventional ion implant process or other technically feasible process. As previously described herein, the second electrode is disposed proximate to the first electrode within the embedded resistive memory cell and is an extended version of one of the electrodes that typically would be present in a conventional high-k metal gate transistor structure. The second electrode extends from under one side of the transistor element within the embedded resistive memory cell to under the entirety of the ReRAM element within the embedded resistive memory cell. In step 210, the trench of the transistor element within the embedded resistive memory cell and the trench of the ReRAM element within the embedded resistive memory cell are formed. Here, a polysilicon layer is first deposited and patterned to form two polysilicon dummy structures, where each polysilicon structure defines one of the two trenches. The trench for the transistor element and the trench for the ReRAM element are then created by depositing a dielectric layer, planarizing the surface of the overall structure, and removing the polysilicon dummy structures.

In step 215, a dielectric layer is formed within the trench of the transistor element. First, dielectric layers of differing thicknesses are built within both the trench of the transistor element and the trench of the ReRAM element using two different selective deposition processes. The thickness of the dielectric layer within the trench of the transistor element is greater than the thickness of the dielectric layer within the trench of the ReRAM element. The dielectric layer is then removed from the trench of the ReRAM element using a non-selective removal process, leaving a layer of dielectric material within the trench of the transistor element. As is trench-understood, a residual amount of dielectric material may persist within the trench of the ReRAM element.

In step 220, a metal oxide layer is simultaneously formed within the trench of the transistor element and within the trench of the ReRAM element using an atomic layer deposition process or other technically feasible process. As previously described herein, the metal oxide material should be a high-k dielectric material and should allow for proper performance of both the transistor element and the ReRAM element within the embedded resistive memory cell. In step 225, which is an optional step, the metal oxide layer within the trench of the ReRAM element may be nitridized using an ammonia-based process or a nitrogen plasma process to increase the amount of vacancies within the metal oxide material. As previously described herein, to the extent nitridization is performed, a protective layer should be built over the transistor element to protect that structure during the nitridization process.

In step 230, a metal layer is simultaneously formed within the trench of the transistor element and within the trench of the ReRAM element. First, a metal layer is added to the embedded resistive memory cell using a conventional deposition process. A polishing process is then used to polish flat the top of the embedded resistive memory cell and remove portions of the metal layer and the metal oxide layer to separate the transistor element and the ReRAM element. The resulting transistor element is comprised of a stack of layers that includes a dielectric layer, a metal oxide layer and a metal layer. Similarly, the resulting ReRAM element is comprised of a stack of layers that includes a metal oxide layer and a metal layer. The respective metal layers within the trenches of the transistor element and the ReRAM element form the top electrodes of those elements.

Once the embedded resistive memory cell has been fabricated, a forming voltage may be applied to the ReRAM element, in step 235, to create conducting filaments within the metal oxide layer of the ReRAM element. Similar to the nitridization process in step 225, step 235 also is optional and may be performed as necessitated by overall specification requirements.

Figure 3A:
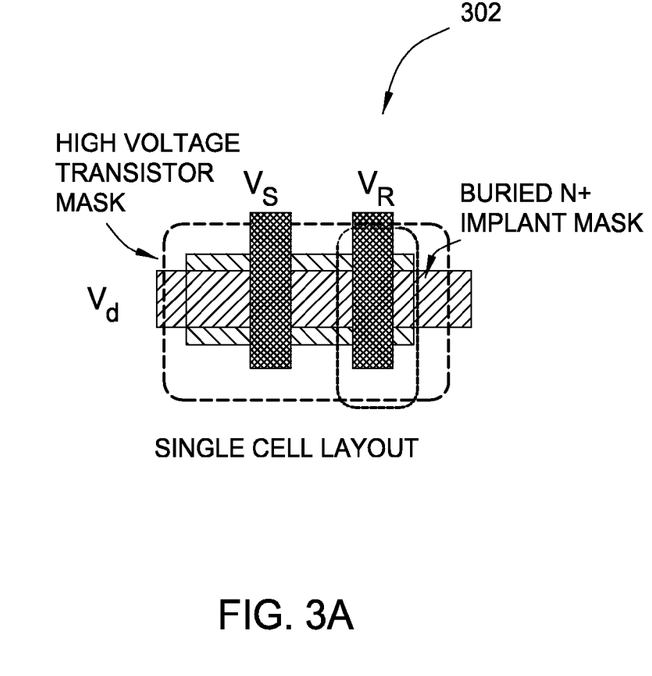
FIGS. 3A-3B illustrate a memory array that includes a multiple embedded resistive memory cells, according to one embodiment of the present invention.
Figure 3B:
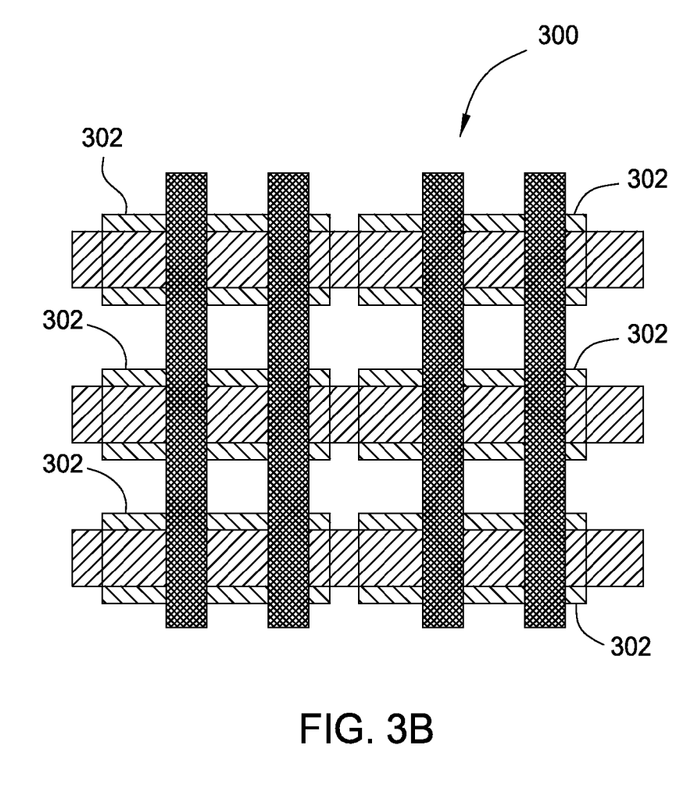

FIGS. 3A-3B illustrate a memory array 300 that includes multiple embedded resistive memory cells 302, according to one embodiment of the present invention. Advantageously, the different embedded resistive memory cells 302 may be arranged in the memory array 300 such that the sources for each transistor are connected to one interconnect line while the gates are connected to another interconnect line. In such an arrangement, conventional memory addressing may be used to access each individual cell.

While the foregoing is directed to embodiments of the present invention, other and further embodiments of the invention may be devised without departing from the basic scope thereof, and the scope thereof is determined by the claims that follow.

We claim:

1. An embedded resistive memory cell, comprising:
   (a.) a first stack of deposited layers comprising:
      a first dielectric layer, and
      a first portion of a second dielectric layer, wherein the second dielectric layer is a high-k dielectric layer and wherein the first portion of the second dielectric layer is disposed above the first dielectric layer; and
   (b.) a first electrode disposed under the first stack;
   (c.) a second stack of deposited layers comprising:
      a second portion of the second dielectric layer, and
      a metal layer disposed above the second dielectric layer; and
   (d.) a second electrode, wherein a first region of the second electrode is disposed under the first stack and a second region of the second electrode is disposed under the second stack, wherein the second electrode is electrically isolated from the first electrode.

2. The embedded resistive memory cell of claim 1, wherein the first dielectric layer comprises silicon dioxide.

3. The embedded resistive memory cell of claim 1, wherein the second dielectric layer comprises a metal oxide.

4. The embedded resistive memory cell of claim of claim 3, wherein the metal oxide comprises hafnium oxide.

5. The embedded resistive memory cell of claim 3, wherein the metal oxide comprises zirconium oxide or lanthanum oxide.

6. The embedded resistive memory cell of claim 1, wherein each of the first portion of the second dielectric layer included in the first stack and the second portion of the second dielectric layer included in the second stack has a thickness of approximately 30 angstroms to approximately 50 angstroms.

7. The embedded resistive memory cell of claim 1, wherein the first dielectric layer has a thickness of approximately 20 angstroms to approximately 120 angstroms.

8. The embedded resistive memory cell of claim 1, wherein the second stack of deposited layers further includes a residual dielectric layer having a thickness that is less than approximately 10 angstroms.

9. The embedded resistive memory cell of claim 1, wherein the second dielectric layer included in the second stack is formed in part using a nitridization process.

10. The embedded resistive memory cell of claim 1, wherein the second dielectric layer included in the second stack is formed in part by applying a forming voltage.

11. The embedded resistive memory cell of claim 1, wherein the first stack forms part of a transistor element, and the second stack forms part of a resistive memory element.

12. A method for creating an embedded resistive memory cell, comprising:
   forming a first electrode and a second electrode, wherein the second electrode is electrically isolated from the first electrode;
   forming a first dielectric layer that is included in a first stack of deposited layers, wherein the first stack is positioned relative to the first electrode such that the first electrode resides under the first stack; and
   forming a second dielectric layer that is simultaneously included in the first stack of deposited layers and included in a second stack of deposited layers, wherein the first stack and the second stack are positioned relative to the second electrode such that the second electrode resides under the first stack and extends from under the first stack to under the second stack.

13. The method of claim 12, further comprising forming a metal layer that is simultaneously included in the first stack of deposited layers and included in the second stack of deposited layers.

14. The method of claim 12, further comprising nitridizing the second dielectric layer included in the second stack.

15. The method of claim 12, further comprising applying a forming voltage to the second dielectric layer included in the second stack.

16. The method of claim 12, wherein the second dielectric layer comprises a metal oxide.

17. The method of claim 16, wherein the metal oxide comprises hafnium oxide.

18. The method of claim 16, wherein the metal oxide comprises zirconium oxide or lanthanum oxide.

19. The method of claim 12, wherein the second dielectric layer included in the first stack and the second stack has a thickness of approximately 30 angstroms to approximately 50 angstroms.

20. The method of claim 12, wherein the first dielectric layer included in the first stack has a thickness of approximately 20 angstroms to approximately 120 angstroms.

21. A memory array, comprising
a plurality of embedded resistive memory cells, wherein at least one of the embedded resistive memory cells comprises:
  (a.) a first stack of deposited layers comprising:
    a first dielectric layer, and
    a first portion of a second dielectric layer, wherein the second dielectric layer is a high-k dielectric layer and wherein the first portion of the second dielectric layer is disposed above the first dielectric layer; and
  (b.) a first electrode disposed under the first stack;
  (c.) a second stack of deposited layers comprising:
    a second portion of the second dielectric layer, and
    a metal layer disposed above the second dielectric layer; and
  (d.) a second electrode, wherein a first region of the second electrode is disposed under the first stack and a second region of the second electrode is disposed under the second stack, wherein the second electrode is electrically isolated from the first electrode.

* * * * *